(12) United States Patent
Ooshima

(10) Patent No.: US 7,587,693 B2
(45) Date of Patent: Sep. 8, 2009

(54) APPARATUS AND METHOD OF DELAY CALCULATION FOR STRUCTURED ASIC

(75) Inventor: Takayuki Ooshima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 324 days.

(21) Appl. No.: 11/414,295

(22) Filed: May 1, 2006

(65) Prior Publication Data

US 2006/0247875 A1 Nov. 2, 2006

(30) Foreign Application Priority Data

May 2, 2005 (JP) .............................. 2005-134012

(51) Int. Cl.
*G06F 17/50* (2006.01)
(52) U.S. Cl. ..................... 716/6; 716/1; 716/2; 716/5; 716/10; 716/12
(58) Field of Classification Search ..................... 716/2, 716/5, 6, 10, 11, 12
See application file for complete search history.

(56) References Cited

U.S. PATENT DOCUMENTS

| | | | |
|---|---|---|---|
| 5,544,068 A | 8/1996 | Takimoto et al. | |
| 5,864,487 A * | 1/1999 | Merryman et al. .............. | 716/6 |
| 6,012,833 A | 1/2000 | Yoshikawa | |
| 6,543,042 B2 * | 4/2003 | Kato ............................ | 716/10 |
| 6,591,407 B1 * | 7/2003 | Kaufman et al. ............... | 716/10 |
| 6,609,228 B1 * | 8/2003 | Bergeron et al. ................ | 716/2 |
| 6,609,241 B2 * | 8/2003 | Yonemori ...................... | 716/12 |
| 6,763,505 B2 * | 7/2004 | Baumgartner et al. ........... | 716/5 |
| 6,981,233 B2 * | 12/2005 | Chang ............................ | 716/6 |
| 7,127,693 B2 * | 10/2006 | Tanaka ........................... | 716/6 |
| 7,127,695 B2 * | 10/2006 | Huang et al. ................... | 716/10 |
| 7,191,418 B2 * | 3/2007 | Lee et al. ........................ | 716/6 |
| 7,272,808 B1 * | 9/2007 | Sharma et al. .................. | 716/6 |
| 7,373,626 B2 * | 5/2008 | Ko ................................. | 716/6 |
| 2006/0184906 A1 * | 8/2006 | Aizawa .......................... | 716/6 |

FOREIGN PATENT DOCUMENTS

| | | |
|---|---|---|
| EP | 0 544 164 A1 | 6/1993 |
| JP | 10-162040 | 6/1998 |
| JP | 11-259555 | 9/1999 |
| JP | 2001-273338 | 10/2001 |

OTHER PUBLICATIONS

M. Terai, et al., "A Clock Distribution Circuit Layout Design Tool for Large-scale and High-speed ASICs," Institute of Japanese Information Processing, vol. 43:5, May 2002, pp. 1294-1303.

* cited by examiner

*Primary Examiner*—Helen Rossoshek
(74) *Attorney, Agent, or Firm*—Foley & Lardner LLP

(57) ABSTRACT

A delay calculation apparatus is provided for delay calculation of a structured ASIC in which a clock circuit is integrated within a master slice. The delay calculation apparatus is composed of a storage unit storing a clock circuit delay library containing clock circuit delay data obtained by delay calculation of a clock circuit, and a delay calculation section performing delay calculation of a structured ASIC incorporating the clock circuit to thereby generate delay calculation result data of the structured ASIC. The delay calculation section is designed to obtain at least a portion of the clock circuit delay data from the clock circuit delay library, and to merge the obtained portion of the clock circuit delay data into the delay calculation result data.

6 Claims, 11 Drawing Sheets

PORTION OF CLOCK CIRCUIT 5 TO BE ARCHIVED INTO LIBRARY

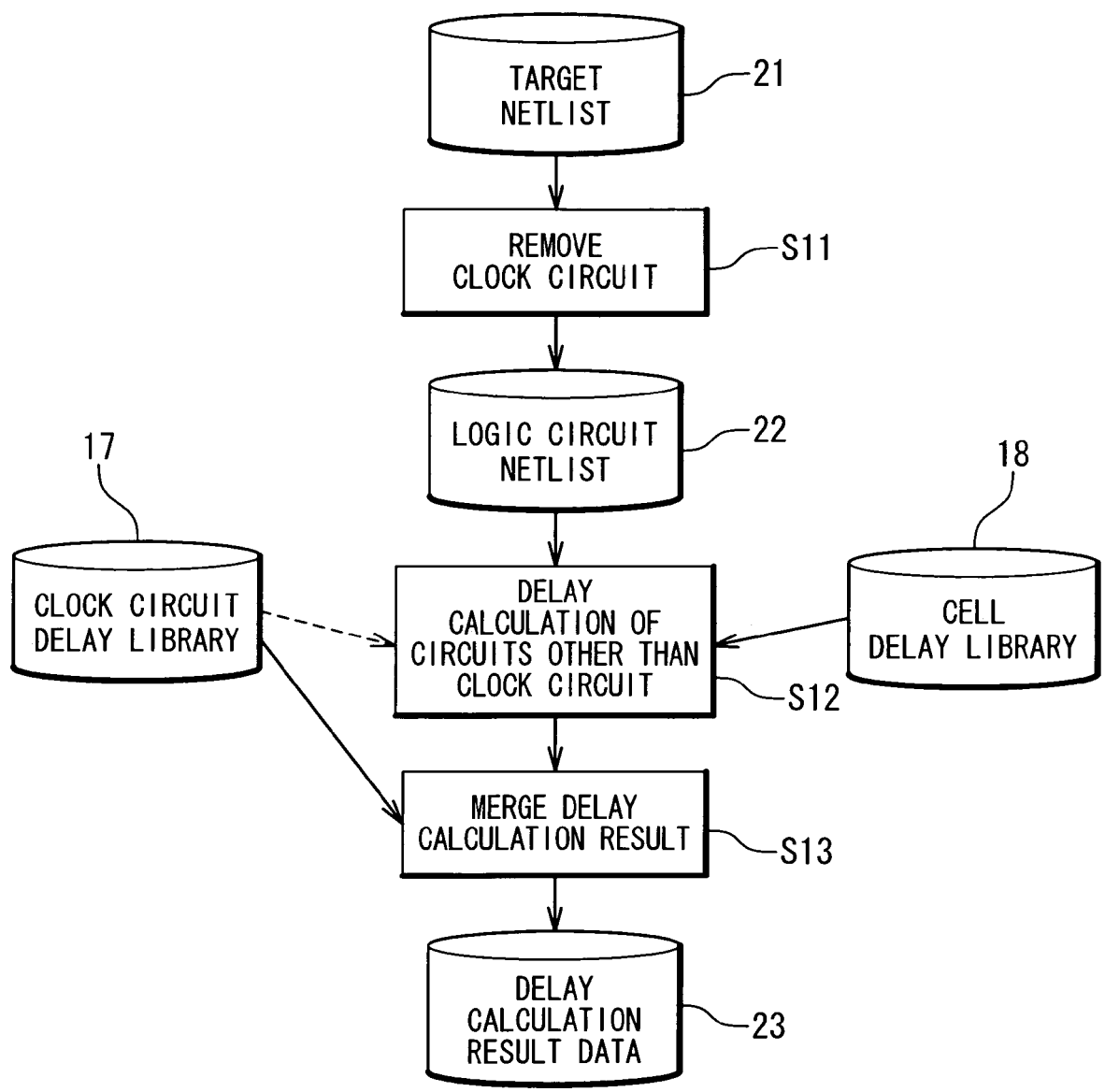

APPARATUS AND METHOD OF DELAY CALCULATION FOR STRUCTURED ASIC

BACKGROUND OF THE INVENTION

1. Field of the Invention

The present invention generally relates to an apparatus and method of delay calculation for structured ASICs (application-specific integrated circuits). More specifically, the present invention is directed to delay calculation for ASICs incorporating clock circuits that used to distribute clock signals.

2. Description of the Related Art

Delay calculation is one of the most important techniques in integrated circuit design. Operating an integrated circuit at desired timings requires accurately estimating delay times of respective circuit components within the integrated circuit by delay calculation, and verifying operation timings of the integrated circuit on the basis of the estimated delay times. For instance, a delay time of a clock circuit integrated within the integrated circuit must be accurately estimated, and then clock skews must be verified as being appropriate on the basis of the estimated delay times. In addition, delay times of desired paths within the integrated circuit must be verified as being appropriate. Under such technical background, various sorts of delay calculation methods have been proposed.

One of the most typical delay calculation methods is a cell-library-based method, which uses a cell delay library describing delay times of respective kinds of cells (refer to, for example, JP-A-Heisei 11-259555). The cell-library-based method is directed to delay calculation of integrated circuits that adopt a cell-based design technique. The cell-library-based method uses a cell library that contains tables describing associations of input slews and/or load capacitances with delay times for respective kinds of cells. Delay times of respective cells integrated within the target integrated circuit are acquired by table lookup from the cell library, referring a netlist of the target integrated circuit. This is followed by delay calculation of desired paths based on the acquired delay times of the respective cells.

Delay calculation of integrated circuits incorporating macro circuits is also known in the art, for instance, in JP-A-Heisei 10-162040 and JP-A 2001-273338. In the known techniques, delay calculation of an integrated circuit incorporating macro circuits is achieved using a macro delay library containing: tables describing associations of delay times of boundary cells connected to input terminals of macro circuits with input slews of the boundary cells; tables describing associations of delay times of boundary cells connected to output terminals of macro circuits with input load capacitances of the boundary cells; and delay times among the boundary cells. Delay calculation for desired paths within the integrated circuit is performed using the delay times acquired from the macro delay library.

Another typical delay calculation method is an analog simulation method. SPICE is one of the most typical simulators for analog simulation. In the analog simulation, a target integrated circuit is expressed by a circuit model described by resistors, capacitors, coils, and other primitive elements, and delay times are calculated by solving the circuit equation corresponding to the circuit model. For instance, a document entitled "A Clock Distribution Circuit Layout Design Tool for Large-scale and High-Speed ASICs" written by Masayuki Terai et al., Institute of Japanese Information Processing, Volume 43, No. 5, Pages 1294 to 1303, May in 2002, discloses that SPICE-compatible circuit simulation is applied to analyze clock skew of a clock circuit within an ASIC.

The inventor of the present invention has discover the fact that delay calculations of clock circuits are wastefully repeated when the conventional delay calculation methods are applied to delay calculations of structured ASICs. Conventionally, every time an integrated circuit is designed, delay times of a clock circuit integrated within the integrated circuit are estimated. For instance, when two structured ASICs are designed, delay times of clock circuits within the respective ASICs are separately calculated. In accordance with investigations by the inventor, performing delay calculations of the clock circuits within the respective structured ASICs wastefully uses design resources, which may undesirably increase the TAT in designing structure ASICs.

SUMMARY OF THE INVENTION

The inventor has discovered that delay calculations of structured ASICs are effectively facilitated by preparing a clock circuit delay library describing a result of delay calculation of a clock circuit integrated within structured ASICs. A clock circuit can be commonly integrated within various structured ASICs by incorporating the clock circuit within master slices of the structured ASICs. Once a clock circuit delay library that describes delay times of the commonly integrated clock circuit is prepared, commonly using the clock circuit delay library for the delay calculations of structured ASICs incorporating the clock circuit effectively reduces the time necessary for the delay calculations.

As long as the inventor knows, preparing a delay library for a clock circuit is not known in the art. This may be because usual integrated circuits have different layout patterns of clock circuits, and there is no technical sense in preparing a delay library of a clock circuit. Interconnect resistances and capacitances within clock circuits are different depending on layout patterns of the clock circuits. In the case that individual integrated circuits have different layout patterns of clock circuits, preparing a delay library for a clock circuit is not effective; however, the structured ASIC technique allows clock circuits having the same layout pattern to be integrated within various integrated circuits. As for structured ASICs, preparing a delay library for a clock circuit effectively reduces the time necessary for delay calculation.

In an aspect of the present invention, a delay calculation apparatus is provided for delay calculation of a structured ASIC in which a clock circuit is integrated within a master slice. The delay calculation apparatus is composed of a storage unit storing a clock circuit delay library containing clock circuit delay data obtained by delay calculation of a clock circuit, and a delay calculation section performing delay calculation of a structured ASIC incorporating the clock circuit to thereby generate delay calculation result data of the structured ASIC. The delay calculation section is designed to obtain at least a portion of the clock circuit delay data from the clock circuit delay library, and to merge the obtained portion of the clock circuit delay data into the delay calculation result data.

The delay calculation apparatus thus constructed effectively eliminates the need for repeating the delay calculation of the clock circuit by through incorporating the clock circuit delay data archived in the clock circuit delay library into the delay calculation result data of various structured ASICs within which the clock circuit is commonly integrated. This effectively reduces time duration necessary for delay calculation of the structured ASICs, and thereby reduces design TATs of the structured ASICs.

BRIEF DESCRIPTION OF THE DRAWINGS

The above and other advantages and features of the present invention will be more apparent from the following description taken in conjunction with the accompanied drawings, in which:

FIG. 10 is a flowchart illustrating an exemplary procedure of calculating entire delays in the structured ASIC in one embodiment of the present invention.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

Structures of Structured ASIC, and Delay Calculating System

Figure 1:
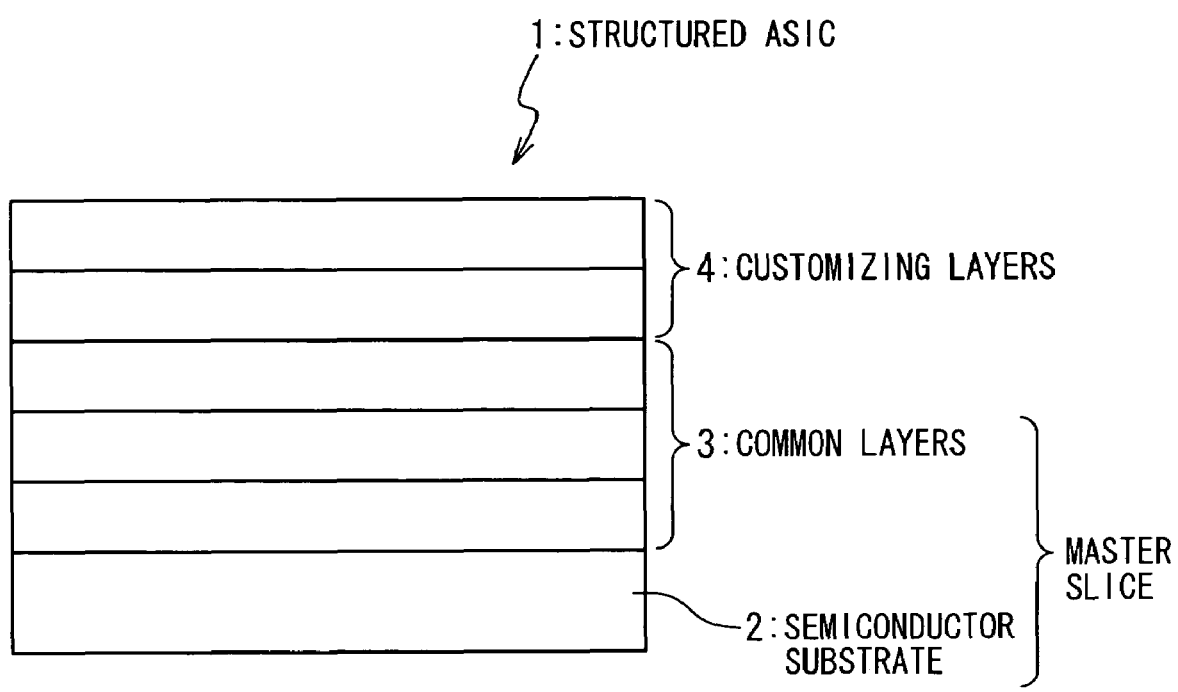
FIG. 1 is a sectional view illustrating an exemplary structure of a structured ASIC in one embodiment of the present invention.

In one embodiment, as shown in FIG. 1, a technical idea for calculating a delay of a structured ASIC (Application Specification Integrated Circuit) 1 is provided, while the structured ASIC 1 is composed of a semiconductor substrate 2 within which MOS transistors are integrated; common layers 3, and customizing layers 4. The common layers 3 are interconnection layers incorporating interconnections which are commonly integrated within various sorts of structured ASICs 1 to provide electrical connections among circuits (for example, I/O buffers and power supply circuits). The customizing layers 4 are interconnection layers incorporating interconnections designed in correspondence with various user specifications. The semiconductor substrate 2 and the common layers 3 are portions which have been preliminarily prepared by a vendor, and may be referred to as a "master slice." In this embodiment, a clock circuit used to distribute clocks is integrated within the master slice. This implies that the clock circuit is commonly integrated within various structured ASICs 1.

Figure 2:
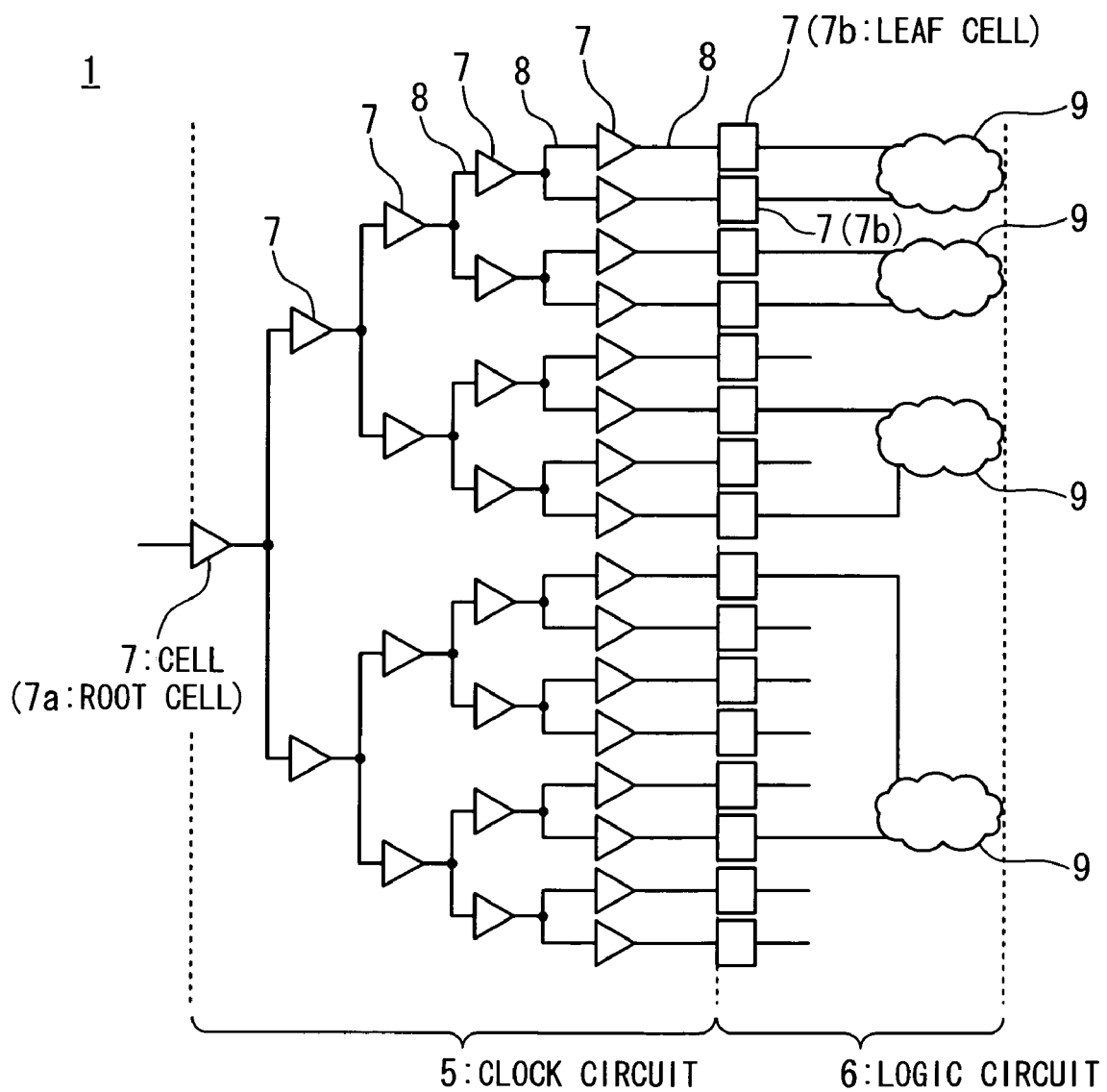
FIG. 2 is a circuit diagram illustrating circuit topology of the structured ASIC in one embodiment of the present invention.

FIG. 2 is a conceptional diagram illustrating an exemplary circuit topology of the structured ASIC 1 in this embodiment. The structured ASIC 1 is provided with a clock circuit 5 which is commonly used, and a logic circuit 6 designed in accordance with user's requests. Interconnections of the clock circuit 5 are integrated within the common layers 3, and interconnections of the logic circuit 6 are integrated within the customizing layers 4.

The clock circuit 5 is composed of cells 7 and interconnections 8 that provide electrical connections among the cells 7. The cells 7 and interconnections 8 are connected to function as a clock tree. One of the cells 7 which is located at a root of the clock tree is referred to as a "root cell 7a", whereas a cell 7 which is located at a leaf of the clock tree is referred to as a "leaf cell 7b." The root cell 7a receives a clock signal to be distributed. The root cell 7a may be a macro circuit, such as a PLL (Phase Locked-loop) circuit and a DLL (Digital lock loop) circuit, a cell which is directly or indirectly connected to an output of such macro circuit, an I/O cell which externally receives a clock signal, and a cell which is directly or indirectly connected to an output of such I/O cell. On the other hand, the leaf cells 7b are used to output clock signals from the clock circuit 5. The leaf cells 7b may be flip-flops or macro circuits to which clock signals are distributed, cells connected to inputs of the flip-flops or the macro circuits, I/O cells that output clock signals, or cells which is directly or indirectly connected to inputs of the I/O cells.

On the other hand, the logic circuit 6 is composed of circuits 9 operating in response to signals received from the leaf cells 7b. The circuits 9 may be composed of combination circuits.

A detailed description is made of the structure and function of a delay calculation system used for delay calculation of the structured ASIC 1 arranged as shown in FIGS. 1 and 2.

Figure 3:
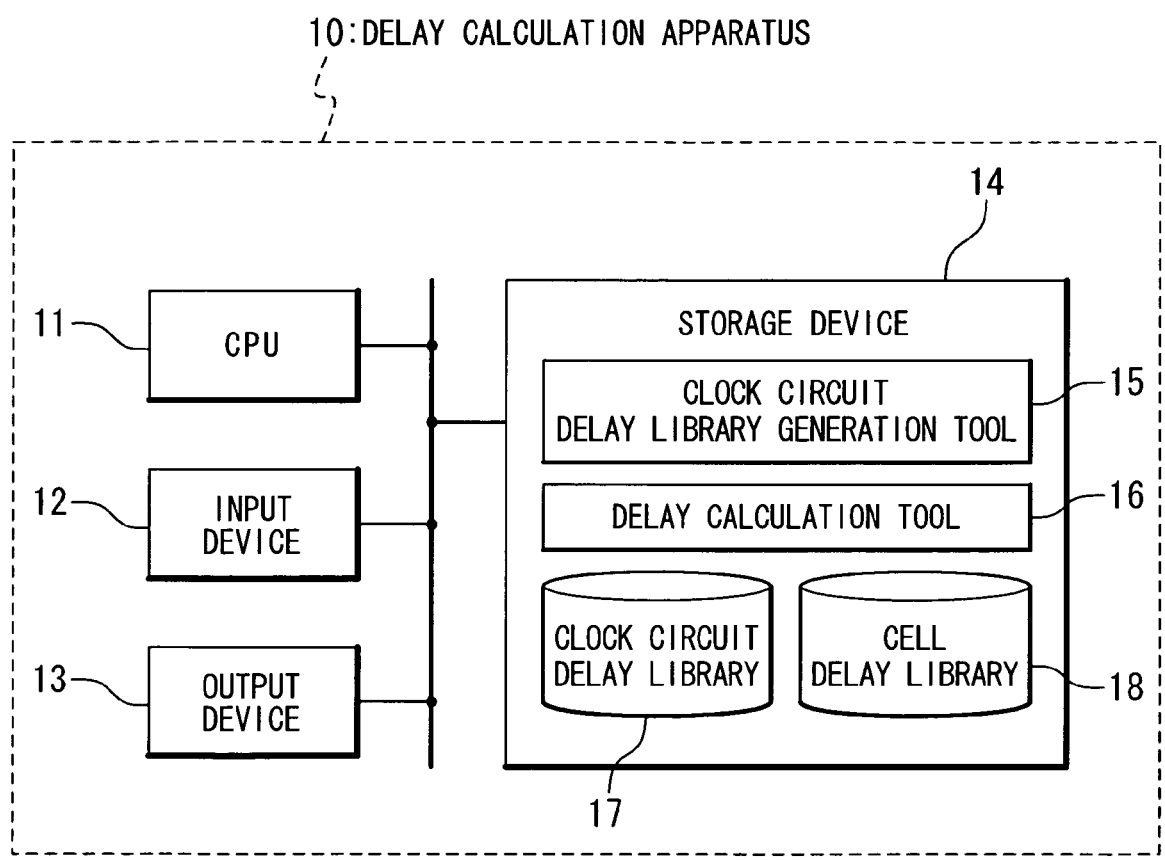
FIG. 3 is a block diagram illustrating a structure of a delay calculation system in one embodiment of the present invention.

FIG. 3 is a block diagram illustrating an exemplary structure of a delay calculation system 10 in one embodiment of the present invention. In this embodiment, commonly-used computer architecture is employed in the delay calculation system 10. Specifically, the delay calculation system 10 is composed of a CPU (Central Processing Unit) 11, an input device 12, such as a keyboard and a mouse, an output device 13, such as a display device and a printer, and a storage device 14 such as an HDD (Hard Disk Drive).

Stored in the storage device 14 are a clock circuit delay library generation tool 15 and a delay calculation tool 16. The clock circuit delay library generation tool 15 is a computer program used to generate a clock circuit delay library 17. The CPU 11 executes code modules contained in the clock circuit delay library generation tool 15 to generate the clock circuit delay library 17. The clock circuit delay library generation tool 15 performs analog simulation as to the clock circuit 5, and stores delay calculation results obtained by the analog simulation in the clock circuit delay library 17. The contents of the clock circuit delay library 17 will be later explained in detail.

The delay calculation tool 16 is a computer program used for delay calculation of an entire circuitry of the structured ASIC 1. The CPU 11 executes code modules contained in the delay calculation tool 16 to perform delay calculation of the entire structured ASIC 1. The delay calculation tool 16 performs the delay calculation of the entire structured ASIC 1 on the basis of the clock circuit delay library 17 and a cell delay library 18. The cell delay library 18 is a library describing delay times of various sorts of cells. Specifically, the cell delay library 18 contains two-dimensional tables describing associations of input slews (typically defined as slew rates of input signals) and load capacitances with delay times for respective cells, and two-dimensional tables describing associations of input slews and load capacitances with output slews (typically defined as slew rates of output signals).

One feature of the delay calculation system 10 in this embodiment is that the clock circuit delay library 17 is preliminarily prepared to store the results of the delay calculations of the clock circuit 5, and used for delay calculations of various structured ASICs 1. This avoids wastefully repeating delay calculations of the same clock circuit 5 integrated within various structured ASICs 1. A detailed explanation will be made of exemplary methods of generating the clock circuit delay library 17 and of performing delay calculation using the clock circuit delay library 17.

Clock Circuit Delay Library

Figure 4:
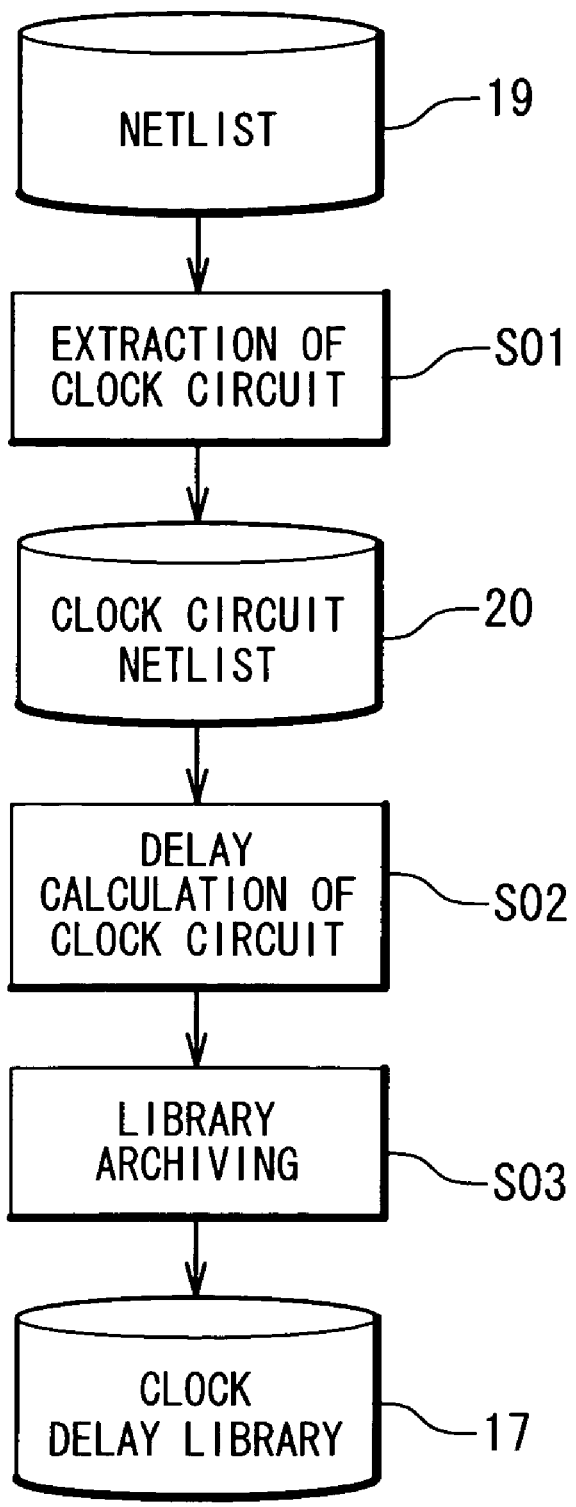
FIG. 4 is a flowchart illustrating an exemplary procedure of generating a clock circuit delay library in one embodiment of the present invention.

FIG. 4 is a flowchart illustrating an exemplary procedure of generating the clock circuit delay library 17 in one embodiment. As previously explained, the clock circuit delay library 17 is generated by the clock circuit delay library generation tool 15.

The procedure of generating the clock circuit delay library 17 begins with clock circuit extraction at Step S01. In the clock circuit extraction, a netlist 19 of a certain structured ASIC 1 is given to the clock circuit delay library generation tool 15. The netlist 19 describes connections of cells integrated within the structured ASIC 1, and capacitances of interconnections connecting the cells. In one embodiment, a netlist of a structured ASIC 1 which incorporates no customizing layer 4 (namely, a netlist of the master slice of the structured ASIC 1) is given as the target netlist 19 to the clock circuit delay library generation tool 15.

The clock circuit delay library generation tool 15 extracts a clock circuit netlist 20 that is a netlist of the clock circuit 5 from the netlist 19.

Figure 5:
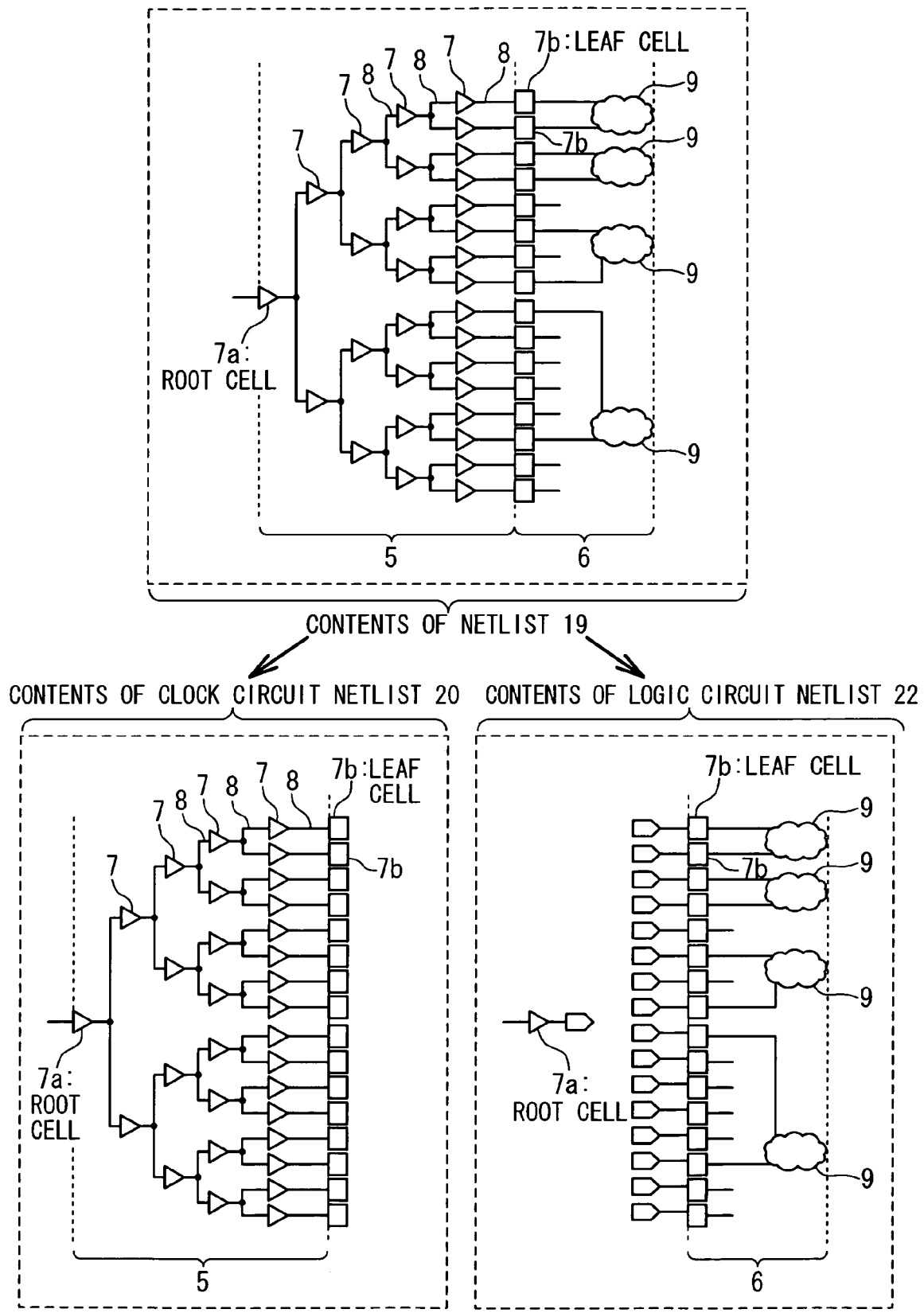
FIG. 5 is a diagram illustrating contents of a netlists in one embodiment of the present invention.

FIG. 5 is a conceptual view illustrating contents of the clock circuit netlist 20. The clock circuit netlist 20 describes connections of the cells 7 integrated within the clock circuit 5, and capacitances of the interconnections integrated within the clock circuit 5. It should be noted that the logic circuit 6 is excluded from the clock circuit netlist 20.

The extraction of the clock circuit netlist 20 is followed by delay calculation of the clock circuit 5 at Step S02. The delay calculation of the clock circuit 5 is achieved by analog simulation based on the clock circuit netlist 20. The use of analog simulation for delay calculation of the clock circuit 5 is advantageous because analog simulation provides highly precise delay calculation for the clock circuit 5, which may be commonly integrated within various structured ASICs 1. The clock circuit 5 is desirably designed so as to reduce clock skews as far as possible, since logic circuits 6 within structured ASICs 1 may be arranged in various manners. In order to assure that the clock skews are sufficiently reduced, analog simulation is used to perform highly precise delay calculation of the clock circuit 5.

Specifically, the following data is calculated in the delay calculation at Step S02:

(1) delay times of the cells 7 and the interconnections 8 integrated within the clock circuit 5.

(2) input slews (typically, slew rates of input signals of the cells 7) of the respective cells 7 except for the root cell 7*a*; and (3) a load capacitance of an output terminal of the root cell 7*a*.

The delay calculation of the clock circuit 5 is followed by clock circuit library archiving at Step S03. In the clock circuit library archiving, the data obtained by the delay calculating operation of the clock circuit 5 is archived as clock circuit delay data into the clock circuit delay library 17.

Specifically, the clock circuit delay data archived in the clock circuit delay library 17 is composed of the following data:

(1) delay time data of the circuit portion between the output terminal of the root cell 7*a* and the input terminals of the respective leaf cells 7*b*;

(2) a load capacitance of the output terminal of the root cell 7*a* (namely, the sum of the capacitances of the interconnections 8 connected to the root cell 7*a*, and input capacitances of the cells 7 connected to the relevant interconnections 8); and (3) input slews of the respective leaf cells 7*b* within the clock circuit 5. The following is a description of the respective data archived in the clock circuit delay library 17.

Figure 6A:
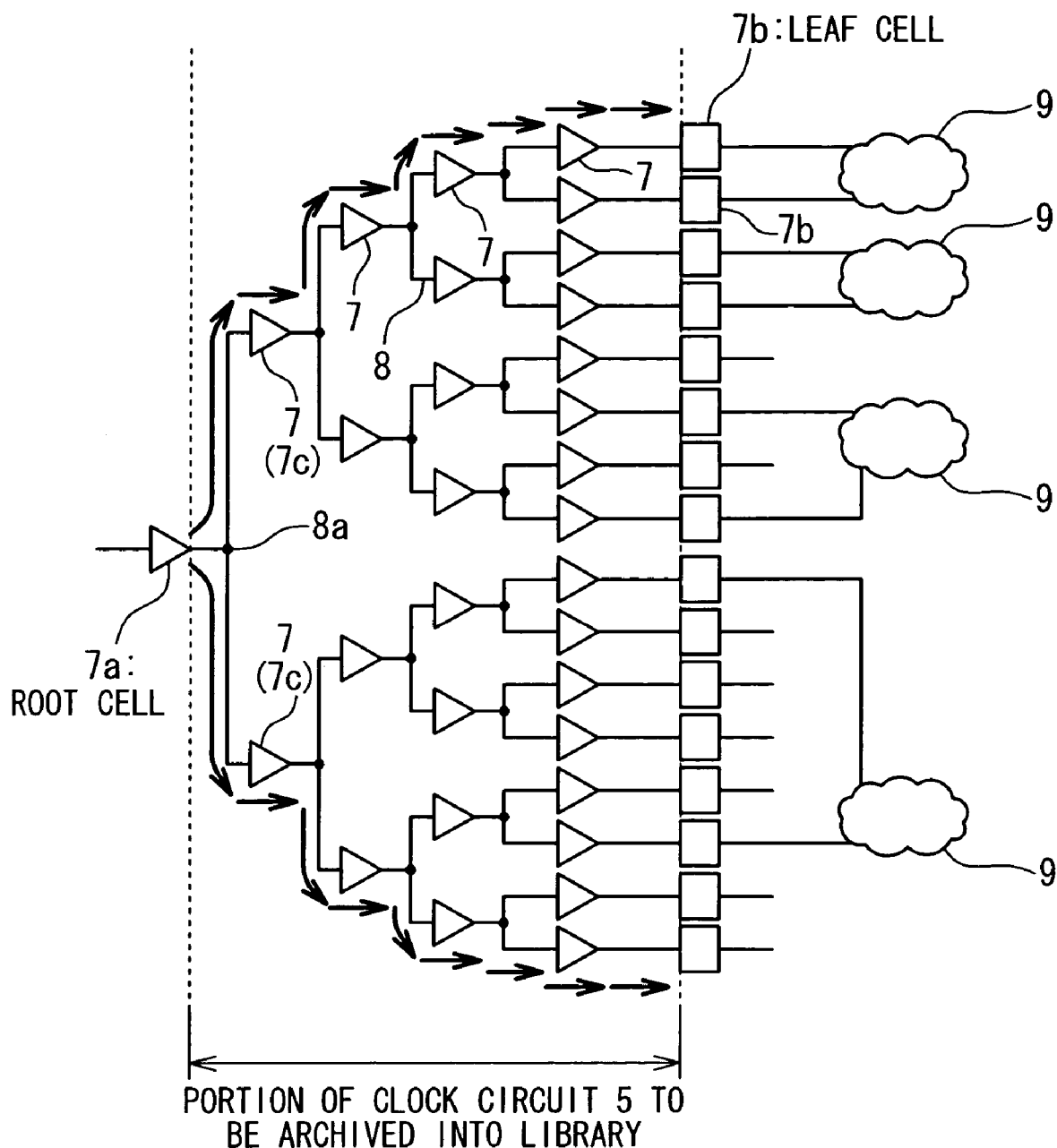
FIG. 6A is a conceptional diagram illustrating contents of a clock circuit delay library in one embodiment of the present invention.
Figure 6B:
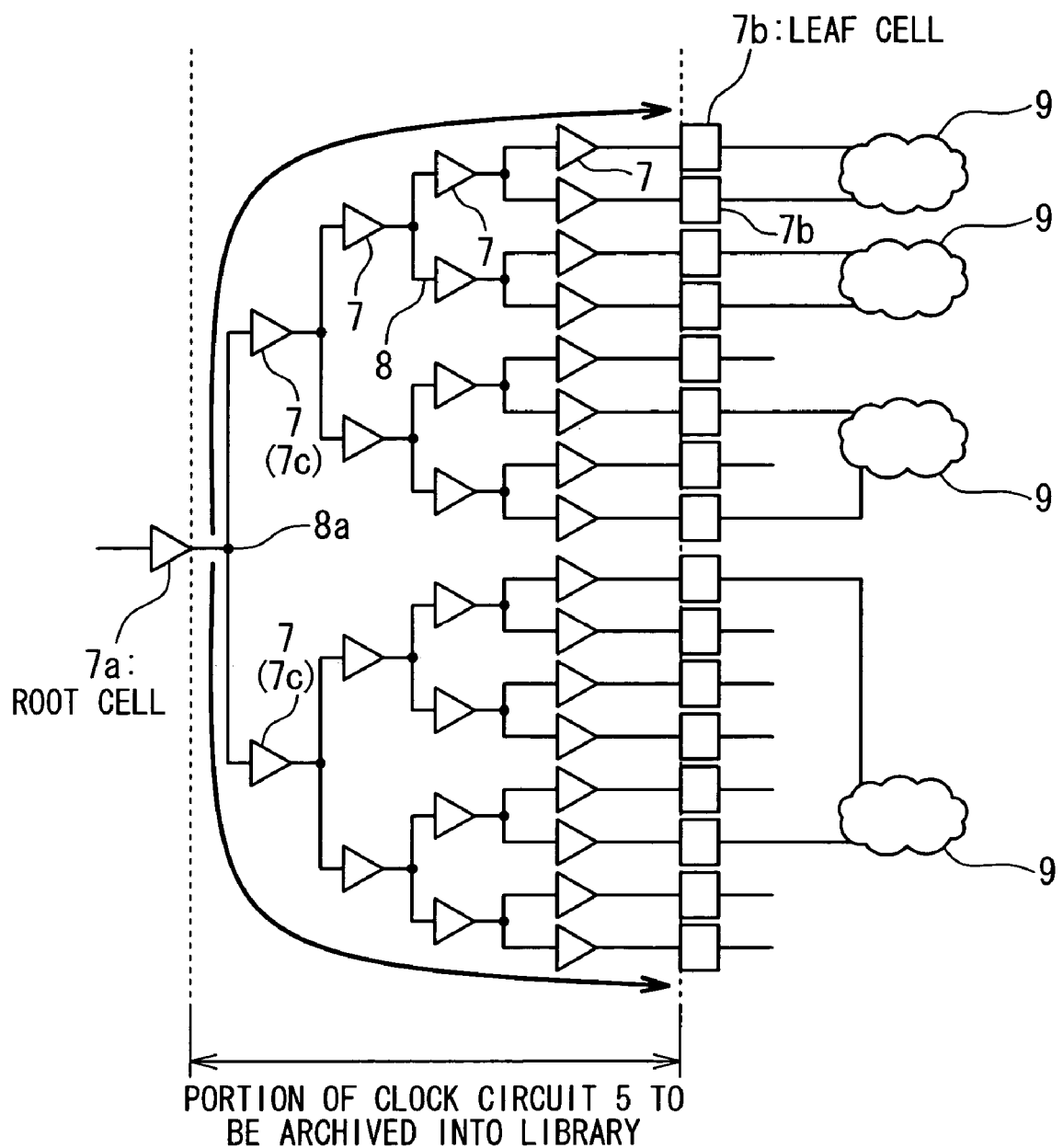
FIG. 6B is a conceptional diagram illustrating contents of a clock circuit delay library in another embodiment of the present invention.

FIGS. 6A and 6B are conceptional diagrams illustrating contents of delay time data stored in the clock circuit delay library 17. In one embodiment, as shown in FIG. 6A, the delay time data archived in the clock circuit delay library 17 include delay times of the respective cells 7 and interconnections 8 located between the output terminal of the root cell 7*a* and the input terminals of the leaf cells 7*b*. In another embodiment, as shown in FIG. 6B, the delay time data archived in the clock circuit delay library 17 include delay times of respective paths from the output terminal of the root cell 7*a* to the input terminals of the respective leaf cells 7*b*, which may be referred to as path delay times. In an alternative embodiment, the delay time data archived in the clock circuit delay library 17 may include both of the delay times of the respective cells 7 and interconnections 8, and the path delay times from the output terminal of the root cell 7*a* up to the input terminals of the respective leaf cells 7*b*. Archiving the delay times of the respective cells 7 and interconnections 8 in the clock circuit delay library 17 is advantageous for performing verification depending upon the paths of the clock circuit 5. This allows, for example, calculating a delay time between two desired points within the clock circuit 5. On the other hand, archiving the path delay times in the clock circuit delay library 17 is advantageous for executing verification that does not depend upon the paths of the clock circuit 5. In this case, each of the paths from the output terminal of the root cell 7*a* of the clock circuit 5 to the input terminals of the respective leaf cells 7*b* is entirely handled as one delay element.

It should be noted that the circuit portion of the clock circuit 5 for which the delay times are archived in the clock circuit delay library 17 is defined as the portion from the output terminal of the root cell 7*a* to the input terminals of the respective leaf cells 7*b*; the root cell 7*a* and the leaf cells 7*b* themselves are not involved in this range. In other words, the delay times of the root cell 7*a* and the leaf cells 7*b* are not described in the clock circuit delay library 17.

The reason why the delay time of the root cell 7*a* is excluded from the clock circuit delay library 17 is that the delay time of the root cell 7*a* varies depending on the input slew of the root cell 7*a*. In order to improve the preciseness of the delay calculations of the entire structured ASIC 1 on the basis of the association of the delay time of the root cell 7*a* with the input slew thereof, it is preferable to calculate the input slew of the root cell 7*a* from the arrangement of the circuit connected to the input of the root cell 7a, and then to calculate the delay time of the root cell 7a from the input slew calculated.

On the other hand, the reason why the delay times of the leaf cells 7b are excluded from the clock circuit delay library 17 is that the data amount of the clock circuit delay library 17 and the calculation amount required for generating the clock circuit delay library 17 are reduced. In general, a delay library of a macro circuit contains delay tables describing associations of delay times of respective output cells within the macro circuit (namely, cells directly connected to the respective output terminals of the macro circuit) with load capacitances of the respective output terminals. However, such approach is not employed for the clock circuit delay library 17. This is because the number of the output terminals of the clock circuit 5 (namely, the number of the leaf cells 7b) is extremely large, due to the fact that clock signals are distributed to a large number of circuits. The number of the leaf cells 7b of the clock circuit 5 may be increased up to several thousands. Providing the delay tables for the respective leaf cells 7b undesirably increases the data amount of the clock circuit delay library 17.

In this embodiment, the clock circuit delay library 17 describes the input slews of the respective leaf cells 7b, instead of incorporating tables describing the delay times of the leaf cells 7b. It should also be noted that the input slews of the respective leaf cells 7b are fixed values. As will be explained later, the delay times of the respective leaf cells 7b are separately calculated on the basis of the input slews of the leaf cells 7b described in the clock circuit delay library 17. This effectively reduces the data amount of the clock circuit delay library 17, and thereby reduces the calculation amount required for generating the clock circuit delay library 17.

Archiving the input slews of the respective leaf cells 7b in the clock circuit delay library 17 is also advantageous in that this eliminates the need for archiving the tables describing associations of output slews of the leaf cells 7b (that is, the slew rates of the output signals of the leaf cells 7b) with the load capacitances thereof in the clock circuit delay library 17. In general, a delay library of a macro circuit contains output slew tables describing associations of output slews of respective output cells within the macro circuit with load capacitances of the respective output terminals. The output slew tables are used for delay calculations of the output cells of the macro circuit. However, preparing the output slew tables for the respective output cells undesirable increases the data amount of the clock circuit delay library 17. In this embodiment, the input slews are archived in the clock circuit delay library 17 instead of output slew tables, to thereby reduce the data amount of the clock circuit delay library 17.

Strictly speaking, the input slew of the root cell 7a, which influences the delay time of the root cell 7a, also slightly influences delay times of the cells 7 connected to the output terminal of the root cell 7a (which will be referred to as the next-staged cells 7c, hereinafter). This is because the input slew of the root cell 7a influences input slews of the next-staged cells 7c, which influences the delay times of the next-stage cells 7. The operation timings of the structured ASIC 1 are desirably verified on the basis of the influences of the input slew of the root cell 7a on the delay times of the next-staged cells 7c.

Figure 7:
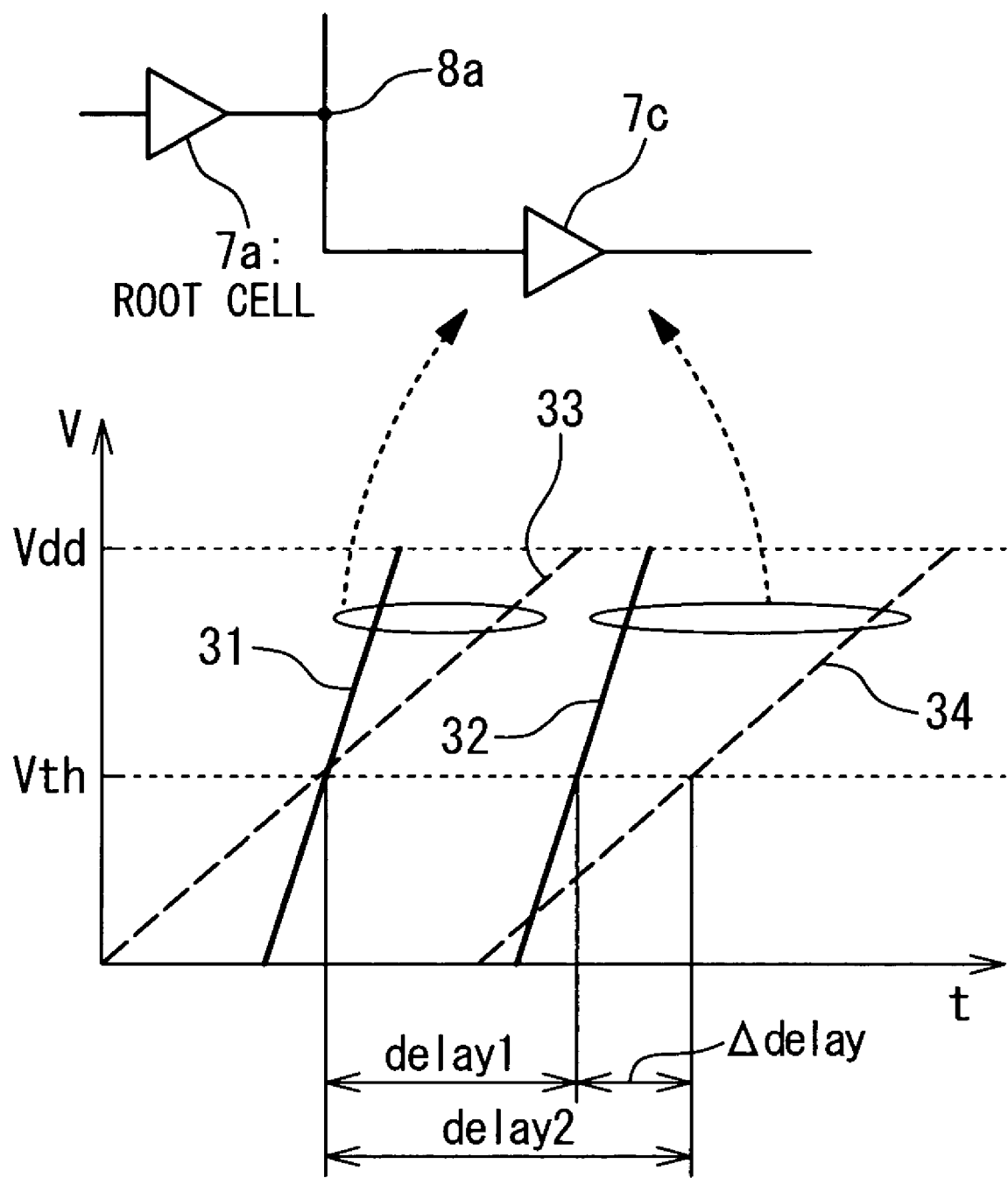
FIG. 7 is a conceptional diagram illustrating a method of calculating a timing margin in one embodiment of the present invention.

In order to allow for the influences of the input slew of the root cell 7a on the delay times of the next-staged cells 7c, it is desirable that timing margins are determined on the basis of the influences of the input slew of the root cell 7a on the delay times of the respective next-staged cells 7c, and then archived into the clock circuit delay library 17. The timing margin for a target next-staged cell 7c is desirably calculated as follows:

Referring now to FIG. 7, a delay time "delay1" of the target next-staged cell 7c is firstly calculated for the case when the input slew rate of the root cell 7a is a predetermined standard value. Specifically, time duration between the pull-up of the input signal of the target next-staged cell 7c up to a threshold value "Vth" (or the pull-down of the input signal to the threshold value "Vth") and the pull-up of the output signal of the target next-staged cell 7c up to the threshold value Vth (or the pull-down of the output signal to the threshold value "Vth") is calculated for the case when the input slew of the root cell 7a is the standard value, and the calculated time duration is defined as the delay time "delay1." It should be understood that, in FIG. 7, the solid lines 31 and 32 indicates the waveforms of the input and output signals of the target next-staged cell 7c with the input slew of the root cell 7a being the standard value, respectively.

Furthermore, a delay time "delay2" of the next-staged cell 7c is calculated for the case when the input slew rate of the root cell 7a is an allowable minimum value. Specifically, time duration between the pull-up of the input signal of the target next-staged cell 7c up to a threshold value "Vth" (or the pull-down of the input signal to the threshold value "Vth") and the pull-up of the output signal of the target next-staged cell 7c up to the threshold value Vth (or the pull-down of the output signal to the threshold value "Vth") is calculated for the case when the input slew rate of the root cell 7a is the allowable minimum value, and the calculated time duration is defined as the delay time "delay2."

The timing margin $\Delta$delay for the target next-staged cell 7c is defined as the difference between the delay time "delay2" and the delay time "delay1", and is archived in the clock circuit delay library 17. In timing verification of a certain path within the clock circuit 5, the operation timing is judged to be proper, when the sum of the delay time of the certain path and the associated timing margin "$\Delta$delay" is in a predetermined range.

Figure 8:
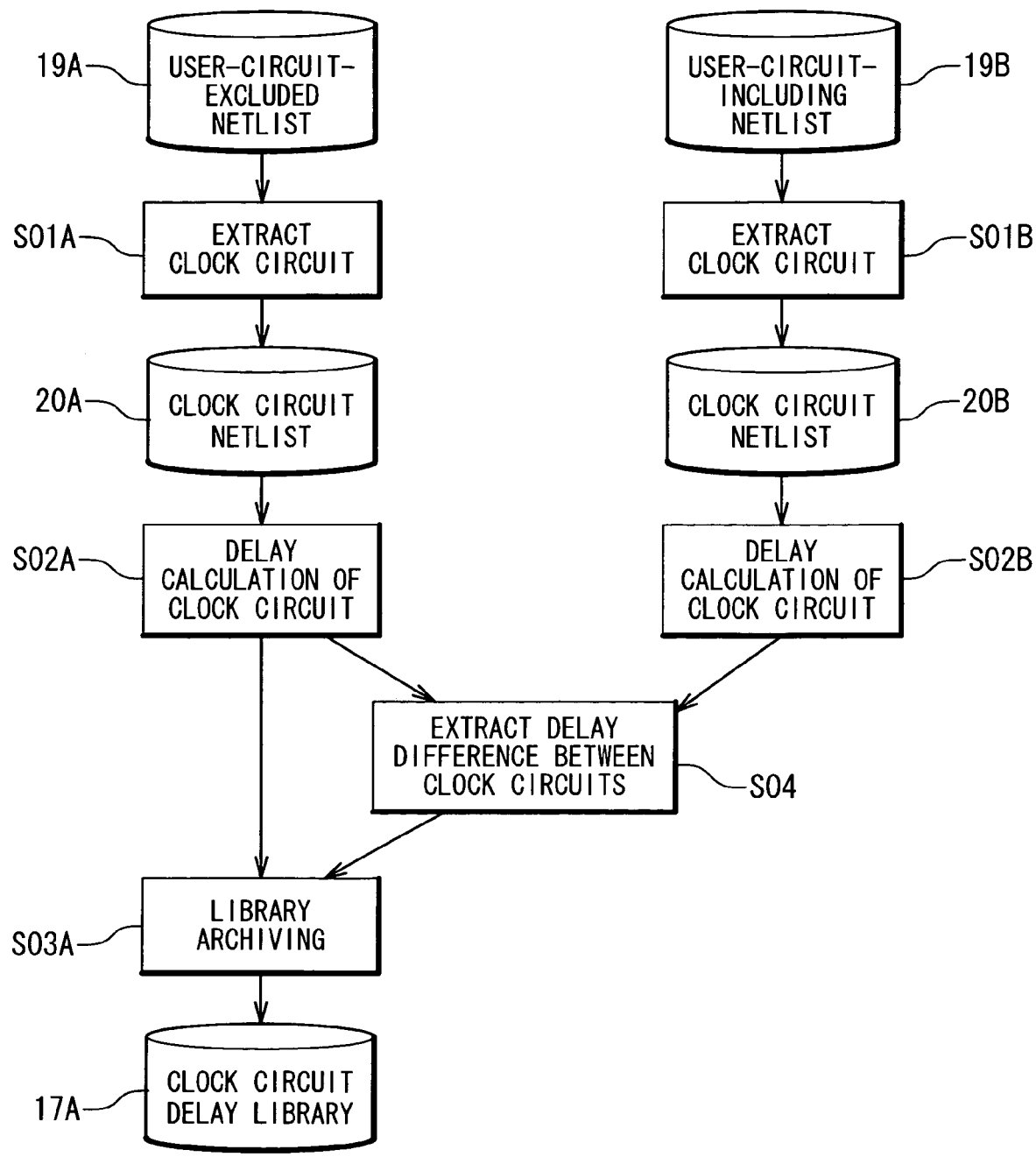
FIG. 8 is a flowchart illustrating an exemplary procedure of generating a clock circuit delay library in an alternative embodiment of the present invention.

FIG. 8 is a flowchart illustrating an exemplary procedure for generating the clock circuit delay library 17 in an alternative embodiment of the present invention. The procedure shown in FIG. 8 addresses allowing for influences of the logic circuit 6 designed in accordance with the user's request on the delay times of the interconnections 8 within the clock circuit 5 in timing verification of the structured ASIC 1. Strictly speaking, the capacitances of the interconnections 8 within the clock circuit 5 changes depending on the layout of the logic circuit 6 due to the capacitive coupling between the interconnections 8 within the clock circuit 5 and the interconnections within logic circuit 6. The capacitive coupling may influence the generation of the clock skews. In this embodiment, clock skew margins are determined on the basis of influences of the changes in the capacitances of the interconnections 8, and archived in the clock circuit delay library 17. In the timing verification of the structured ASIC 1, a clock skew of the clock circuit 5 is judged to be proper, when the sum of the clock skew of the clock circuit 5 calculated by delay calculation and the associated skew margin is smaller than a predetermined reference value.

More specifically, the generation of the clock circuit delay library 17 in this embodiment begins with clock circuit extractions at Steps S01A and S01B for a user-circuit-excluded netlist 19A and a use-circuit-including netlist 19B, respectively. The user-circuit-excluded netlist 19A is a netlist of a structured ASIC 1 incorporating no logic circuit 6 (namely, a netlist of a structured ASIC 1 in which no customized layer 4 is integrated), while the use-circuit-including netlist 19B is a netlist of a structured ASIC 1 incorporating a logic circuit 6 (namely, a netlist of a structured ASIC 1 in which one or more customized layers 4 are integrated. The user-circuit-excluded netlist 19A and the use-circuit-including netlist 19B describe connections of the cells, and capacitances of interconnections providing electrical connections among the cells. As will be understood from the following description, it is important that the user-circuit-excluded netlist 19A and the use-circuit-including netlist 19B describe the capacitances of the interconnections.

In a preferred embodiment, the user-circuit-including netlist 19B is a netlist of the structured ASIC 1 that is designed to cause most severe capacitive coupling, namely, the structured ASIC 1 incorporating a logic circuit 6 having such a structure that the coupling capacitances between the interconnections within the clock circuit 5 and the logic circuit 6 are increased as far as possible.

Upon receiving the user-circuit-excluded netlist 19A and the user-circuit-including netlist 19B, the clock circuit delay library generation tool 15 extracts clock circuit netlists 20A and 20B from the user-circuit-excluded netlist 19A and the use-circuit-including netlist 19B, respectively. The clock circuit netlist 20A is a netlist corresponding to the clock circuit 5 extracted from user-circuit-excluded netlist 19A, and the clock circuit netlist 20B is a netlist corresponding to the clock circuit 5 extracted from user-circuit-including netlist 19B. Although describing the structure of the clock circuit 5 (namely, the connections of the cells within the clock circuit 5) in the same manner, the clock circuit netlists 20A and 20B differently describes the capacitances of the interconnections within the clock circuit 5. The differences in the interconnection capacitances give influences on the delay times of the clock circuit 5.

After the extraction of the clock circuit netlists 20A and 20B, clock circuit delay calculations are carried out for the clock circuit netlists 20A and 20B at Steps S02A and S02B. Specifically, the following data are calculated in the clock circuit delay calculations at Steps S02A and S02B for the respective clock circuit netlists 20A and 20B:

(1) delay times of the respective cells 7 and interconnections 8 within in the clock circuit 5;

(2) input slews of the cells 7 (typically, slew rates of input signals thereof) within the clock circuit 5 except for the root cell 7a; and (3) a load capacitance of the output terminal of the root cell 7a.

It should be noted that the clock circuit netlist 20A is associated with the case where no logic circuit 6 is integrated within the structured ASIC 1, while the clock circuit netlist 20B is associated with the case where a specific logic circuit 6 is integrated within the structured ASIC 1. The delay calculations are carried out by using analog simulation.

After the clock circuit delay calculations, delay time differences are extracted at Step S04. Specifically, delay times of respective paths (that is, path delay times) from the output terminal of the root cell 7a to the input terminals the respective leaf cells 7b are calculated with respect to both of the clock circuit netlists 20A and 20B. The difference of the path delay times between the case where the logic circuit 6 is incorporated and the case where no logic circuit 6 is incorporated is calculated for each path within the clock circuit 5 from the clock circuit netlists 20A and 20B.

This is followed by library archiving at Step S03A. In the library archiving, the data obtained by the clock circuit delay calculations and the delay time difference extraction are archived in the clock circuit delay library 17A. More specifically, the following data is archived in the clock circuit delay library 17A:

(1) delay time data of the circuit portion between the output terminal of the root cell 7a and the input terminals of the respective leaf cells 7b;

(2) a load capacitance of the output terminal of the root cell 7a (namely, the sum of the capacitances of the interconnections 8a connected to the root cell 7a, and input capacitances of the cells 7 connected to the interconnections 8a); and (3) input slews of the respective leaf cells 7b within the clock circuit 5 (typically, slew rates of input signals of the respective leaf cells 7b). Additionally, the differences of the path delay times obtained at Step S04 are archived in the clock circuit delay library 17A.

In the timing verification of the structured ASIC 1, the clock skew of the clock circuit 5 is judged to be proper, when the sum of the clock skew of the clock circuit 5 calculated by the delay calculation and the clock skew margin is smaller than a predetermined reference value.

As previously explained, the delay time data stored in the clock circuit delay library 17A may be the delay times of the respective cells 7 and interconnections 8 (See FIG. 6A), and the path delay times of the respective paths from the output terminal of the root cell 7a to the input terminals of the respective leaf cells 7b (See FIG. 6B). Alternatively, both of the delay times of the respective cells 7 and interconnections 8, and the path delay times of the respective paths from the output terminal of the root cell 7a to the input terminals of the respective leaf cells 7b may be archived in the clock circuit delay library 17A.

In a preferred embodiment, the generation of the clock circuit delay library 17 (or 17A) is accompanied by performing signal integrity verification of the clock circuit 5. This effectively eliminates the need for wastefully repeating the signal integrity verification of the clock circuit 5 in designing various structured ASICs that commonly incorporates the clock circuit 5.

Figure 9:
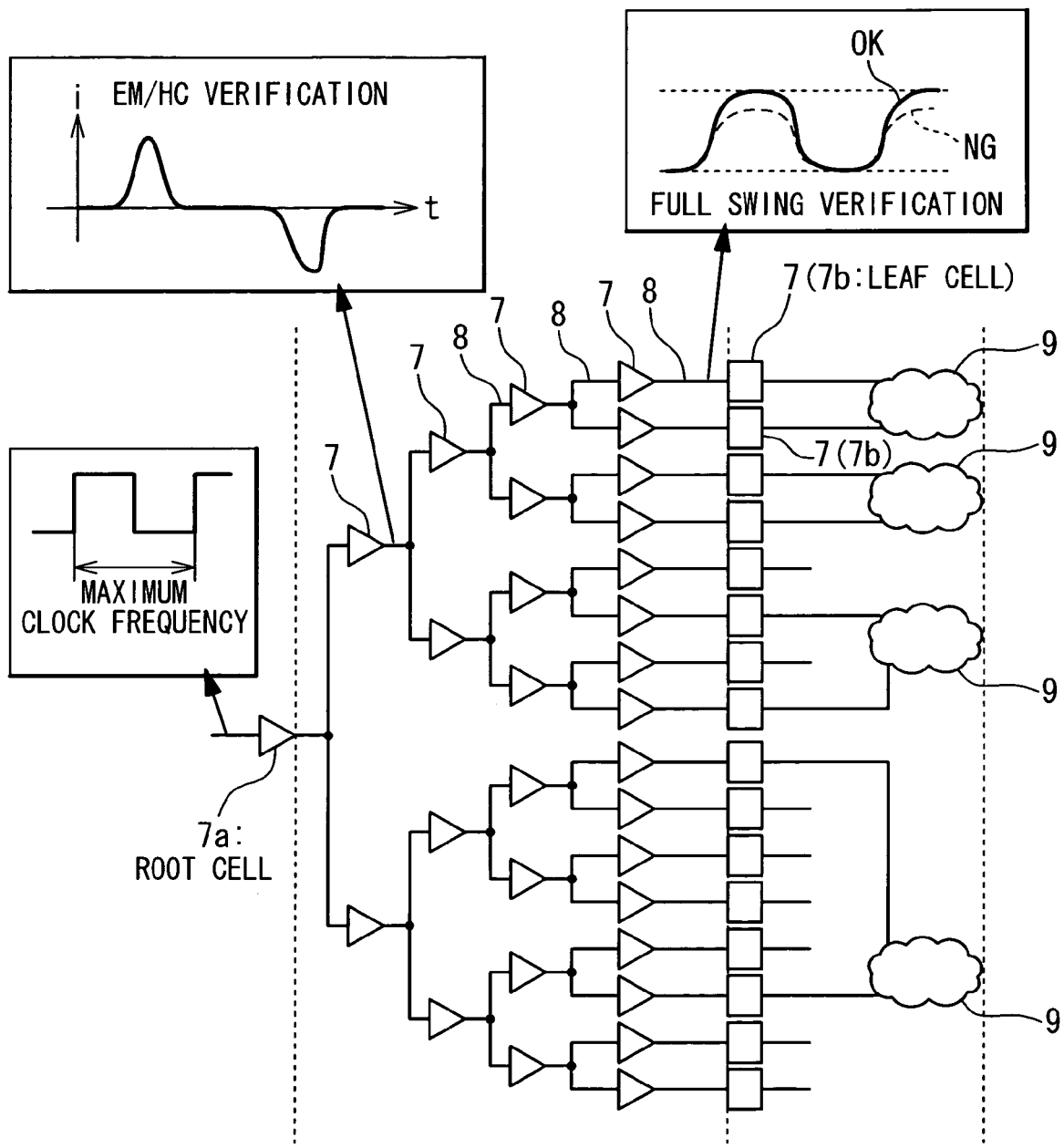
FIG. 9 is a conceptional diagram for explaining signal integrity verification in one embodiment of the present invention.

Referring now to FIG. 9, the signal integrity verification of the clock circuit 5 is achieved by using analog simulation under a condition that a clock signal having the allowable maximum frequency is fed to the root cell 7a within the structured ASIC 1. The use of analog simulation for the signal integrity verification is preferable to improve the preciseness of the signal integrity verification. The signal integrity verification preferably includes full swing verification, electromigration verification, and hot carrier reliability verification.

The full swing verification involves calculating waveforms of the clock signals inputted to the input terminals of the respective leaf cells 7b by the analog simulation, and examining whether or not the respective clock signals are fully switched between the ground level "$V_{SS}$" and the power supply level "$V_{DD}$." In the case that any clock signal is not fully switched, the delay calculation system 10 outputs an error message from the output device 13 so as to notify the occurrence of the error in the full swing verification to the design engineer. This effectively promotes the design engineer to modify the specifications and/or design of the structured ASIC, so that the allowable maximum frequency is reduced, or the clock circuit 5 is redesigned.

The electromigration verification involves calculating current waveforms of output terminals of the respective cells 7 within the clock circuit 5 by analog simulation, and examining whether or not the calculated current waveforms satisfy a predetermined standard of the electromigration verification. Finally, the hot carrier reliability verification involves examining whether or not current waveforms of the output terminals of the respective cells 7 satisfy a predetermined standard of the hot carrier reliability verification. When the current waveform of the output terminal of any cell 7 does not satisfy the predetermined standards, the delay calculation system 10 outputs an error message from the output device 13 so as to notify the occurrence of an error in the electromigration and/or hot carrier reliability verifications to the design engineer. This effectively promotes the design engineer to modify the specifications and/or design of the structured ASIC, so that the allowable maximum frequency is reduced, or the clock circuit 5 is redesigned.

Delay Calculation Using Clock Circuit Delay Library

As previously explained, the delay calculation of the entire structured ASIC 1 is performed using the clock circuit delay library 17 (or 17A). FIG. 10 is a flowchart illustrating an exemplary procedure of the delay calculation of the entire structured ASIC 1.

The delay calculation of the entire structured ASIC 1 begins with removing the clock circuit 5 from the netlist of the entire structured ASIC 1 at Step S11. Specifically, a target netlist 21 which is a netlist of the target structured ASIC 1 is given to the delay calculation tool 16, and the netlist portion corresponding to the circuit portion of the clock circuit 5 for which the delay time data is archived into the clock circuit delay library 17 is removed from the target netlist 21 by the delay calculation tool 16 to thereby generate a logic circuit netlist 22.

Contents of the logic circuit netlist 22 are illustrated in a lower right portion of FIG. 5. The logic circuit netlist 22 describes connections of the cells and capacitances of the interconnections that connect the cells for the target structured ASIC 1 except for the circuit portion between the output terminal of the root cell 7a and the input terminals of the leaf cells 7b. It should also be noted that the logic circuit netlist 22 includes the descriptions as to the root cell 7a and the leaf cells 7b.

Referring back to FIG. 10, the removal of the clock circuit 5 from the target netlist 21 is followed by delay calculation based on the logic circuit netlist 22 for the circuit portion other than the clock circuit 5 at Step S12. The delay calculation is directed to the circuit portion of the structured ASIC 1 other than the portion between the output terminal of the root cell 7a and the input terminals of the leaf cells 7b. Specifically, the delay times of the respective cells and interconnections, and the input slews of the respective cells are calculated through table lookup of the cell delay library 18, with respect to the circuit portion other than the portion from the output terminal of the root cell 7a to the input terminals of the leaf cells 7b.

It should be noted that the delay times of the root cell 7a and the leaf cells 7b are calculated the delay calculation at Step S12; the delay times of the root cell 7a and the leaf cells 7b are not described in the clock circuit delay library 17.

The calculation of the delay time of the root cell 7a begins with calculating the input slew of the root cell 7a on the basis of the data described in the logic circuit netlist 22 and the cell delay library 18. In addition, the load capacitance of the output terminal of the root cell 7a is obtained from the clock circuit delay library 17. In FIG. 10, the broken line indicates that the load capacitance of the output terminal of the root cell 7a is obtained from the clock circuit delay library 17. The delay time of the root cell 7a is calculated on the basis of the thus-obtained input slew and load capacitance of the root cell 7a through table lookup of the cell delay library 18.

The calculation of the delay times of the leaf cells 7b, on the other hand, begins with obtaining the input slews of the respective leaf cells 7b from the clock circuit delay library 17. In FIG. 10, the broken line indicates that the input slews of the respective leaf cells 7b are obtained from the clock circuit delay library 17. Additionally, the load capacitances of the output terminals of the leaf cells 7b are calculated from the data described in the logic circuit netlist 22 and the cell delay library 18. The delay times of the leaf cells 7b are calculated from the thus-obtained input slews and load capacitances of the respective leaf cells 7b through table lookup of the cell delay library 18.

Subsequently, this is followed by merging delay calculation result at Step S13. Specifically, the result of the delay calculation obtained at Step S12 is merged with the data obtained from the clock circuit delay library 17 to generate delay calculation result data 23 which describes entire delay information of the target structured ASIC 1. In this embodiment, the delay calculation result data 23 describes the following data:

(1) delay times of the respective cells and interconnections integrated within the structured ASIC 1, including the delay times of the cells 7 and interconnections 8 within clock circuit 5; and (2) input slews of the respective cells integrated within the structured ASIC 1.

The delay calculation result data 23 may additionally or alternatively include the path delay times of the paths from the output terminal of the root cell 7a to the input terminals of the respective leaf cells 7b. The timing verification of the structured ASIC 1 is carried out on the basis of the delay times and the input slews described in the delay calculation result data 23.

In conclusion, the system and method of delay calculation in this embodiment involves generating the clock circuit delay library 17 storing the delay calculation results of the clock circuit 5 and performing delay calculation of the structured ASIC 1 using the clock circuit delay library 17. This eliminates the need for repeating the delay calculation of the clock circuits 5 in the delay calculations of various structured ASICs 1. Avoiding the wasteful repetition of the delay calculation of the clock circuit 5 effectively reduces TATs of structured ASIC design.

It is apparent that the present invention is not limited to the above-described embodiments, which may be modified and changed without departing from the scope of the invention.

What is claimed is:

1. A delay calculation apparatus for delay calculation of a structured ASIC in which a clock circuit is integrated within a master slice, comprising:

a storage device containing a clock circuit delay library archiving clock circuit delay data obtained by delay calculation of a clock circuit; and a delay calculation section performing delay calculation of a structured ASIC including said clock circuit to generate delay calculation result data of said structured ASIC, wherein said delay calculation section is configured to obtain at least a portion of said clock circuit delay data from said clock circuit delay library, and to merge said obtained portion into said delay calculation result data, wherein said clock circuit includes cells and interconnections connected together to form a clock tree, said cells comprising a plurality of leaf cells corresponding to leafs of said clock tree, wherein said clock circuit delay data within said clock circuit delay library includes clock circuit delay time data associated with a circuit portion of said clock circuit from a predetermined portion of said clock circuit to input terminals of said leaf cells, and wherein data of delay times of said leaf cells are excluded from said clock circuit delay library, wherein the data of a delay time of a root cell corresponding to a root of said clock tree that is excluded from said clock circuit delay library is received and stored as a user-circuit-excluded netlist, wherein data corresponding to a netlist of the ASIC designed to cause most severe capacitive coupling is stored as a user-circuit-including netlist, wherein a first and second delay calculations of clock circuits are respectively computed based on the user-circuit-excluded netlist and the user-circuit-including netlist, and wherein a delay difference between clock circuits of the first and second delay calculations is extracted and stored in the storage device.

2. The delay calculation apparatus according to claim 1, wherein said clock circuit delay time data include delay times of respective cells and interconnections located between said predetermined position and said leaf cells.

3. The delay calculation apparatus according to claim 1, wherein said clock circuit delay time data include delay times of respective paths between said predetermined position and said leaf cells.

4. The delay calculation apparatus according to claim 1, wherein said clock circuit delay data within said clock circuit delay library include data indicative of input slews of said leaf cells, and wherein said delay calculation section is configured to obtain said input slews of said leaf cells from said clock circuit delay library, to calculate delay times of said leaf cells from said obtained input slews of said leaf cells, and to describe said calculated delay times of said leaf cells in said delay calculation result data.

5. The delay calculation apparatus according to claim 1, wherein said cells includes said root cell, wherein said predetermined position is located on an output terminal of said root cell, and wherein data of a delay time of said root cell is excluded from said clock circuit delay library.

6. The delay calculation apparatus according to claim 5, wherein said clock circuit delay data within said clock circuit delay library includes a load capacitance of said output terminal of said root cell, and wherein said delay calculation section is configured to obtain said load capacitance of said output terminal of said root cell from said clock circuit delay library, to calculate a delay time of said root cell from said obtained load capacitance of said output terminal of said root cell, and to describe said calculated delay time of said root cell in said delay calculation result data.

* * * * *